(12) United States Patent
Chang et al.

(10) Patent No.: US 10,396,506 B2
(45) Date of Patent: Aug. 27, 2019

(54) CABLE CONNECTOR WITH FILTER FUNCTION

(71) Applicants: U.D.ELECTRONIC CORP., Taoyuan (TW); U.D.(DONGGUAN) ELECTRONIC TECHNOLOGY CORP., Dongguan (CN); U.D.(ZHONG JIANG) ELECTRONIC CORP., Deyang, Sichuan Province (CN)

(72) Inventors: Chih-Kai Chang, Taoyuan (TW); Bin Zeng, Taoyuan (TW); Yao-Ching Huang, Taoyuan (TW)

(73) Assignees: U.D.ELECTRONIC CORP., Taoyuan (TW); U.D.(DONGGUAN) ELECTRONIC TECHNOLOGY CORP., Guangdong Province (CN); U.D.(ZHONG JIANG) ELECTRONIC CORP., Sichuan Province (CN)

(*) Notice: Subject to any disclaimer, the term of this patent is extended or adjusted under 35 U.S.C. 154(b) by 0 days.

(21) Appl. No.: 16/120,397

(22) Filed: Sep. 3, 2018

(65) Prior Publication Data

US 2019/0089102 A1 Mar. 21, 2019

(30) Foreign Application Priority Data

Sep. 20, 2017 (CN) .................... 2017 2 1205613 U
Sep. 20, 2017 (CN) .................... 2017 2 1207151 U
Sep. 20, 2017 (CN) .................... 2017 2 1207295 U

(51) Int. Cl.
*H01R 13/66* (2006.01)
*H01R 13/719* (2011.01)
(Continued)

(52) U.S. Cl.
CPC ......... *H01R 13/719* (2013.01); *H01R 13/405* (2013.01); *H01R 13/502* (2013.01);
(Continued)

(58) Field of Classification Search
CPC .. H01R 13/719; H01R 13/405; H01R 13/502; H01R 13/62; H01R 13/6581; H01R 13/6658; H05K 1/18
(Continued)

(56) References Cited

U.S. PATENT DOCUMENTS 8,066,530 B2 * 11/2011 Masucci ................ H05K 5/069
439/620.21
8,092,255 B2 * 1/2012 Wang ...................... F21V 23/06
362/365
(Continued)

*Primary Examiner* — Khiem M Nguyen

(57) ABSTRACT

A compact cable connector includes an insulative block set consisting of a docking member and a terminal holder block assembly, a circuit board set including an input circuit board vertically set between the docking member and the terminal holder block assembly and an output circuit board transversely mounted on the top of the terminal holder block assembly, and a terminal set including input terminals transversely mounted in the docking member and electrically bonded to the input circuit board, output terminals vertically mounted in the terminal holder block assembly and electrically bonded to the output circuit board and connection terminals electrically connected between the input circuit board and the output circuit board.

6 Claims, 8 Drawing Sheets

(51) Int. Cl.
  *H01R 13/405*   (2006.01)
  *H01R 13/502*   (2006.01)
  *H01R 13/62*    (2006.01)
  *H01R 13/6581*  (2011.01)
  *H05K 1/18*     (2006.01)

(52) U.S. Cl.
  CPC ......... *H01R 13/62* (2013.01); *H01R 13/6581* (2013.01); *H01R 13/6658* (2013.01); *H05K 1/18* (2013.01)

(58) Field of Classification Search
  USPC .................................................... 439/620.21
  See application file for complete search history.

(56) References Cited

U.S. PATENT DOCUMENTS

| | | | |
|---|---|---|---|
| 8,231,406 B2 * | 7/2012 | Burris | H01R 24/44 439/578 |
| 8,529,297 B2 * | 9/2013 | Chang | H01R 13/6658 439/620.09 |
| 8,624,689 B2 * | 1/2014 | Hsieh | H01R 13/6608 333/185 |

\* cited by examiner

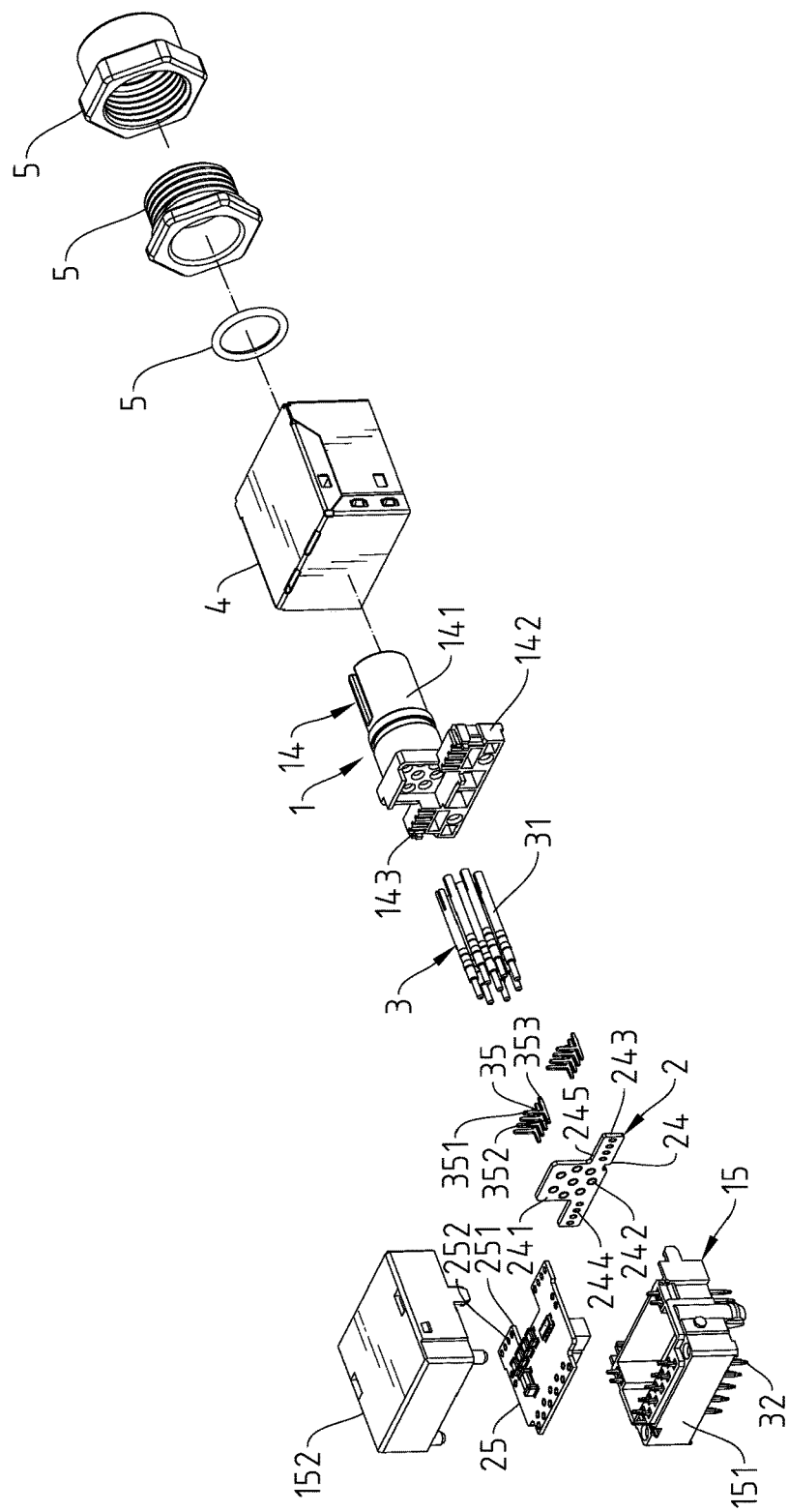

CABLE CONNECTOR WITH FILTER FUNCTION

BACKGROUND OF THE INVENTION

1. Field of the Invention

The present invention relates to cable connector technology and more particularly to a cable connector having a filter function, a small size and a simple structure.

2. Description of the Related Art

Conventional electrical connectors, such as M8 connectors and M12 connectors, are purely mechanical connectors, which are mainly composed of an electrically insulative plastic housing and a plurality of terminals. Connectors composed of such components can only be used for the transmission of low-frequency signals. If these connectors are used for high frequency application, signal transmission stability and signal transmission quality can be damaged. The solution adopted for high-frequency transmission today is to install an electronic filter device in the circuit board. This design inevitably occupies the internal space of the equipment, affecting the circuit layout of the equipment.

SUMMARY OF THE INVENTION

The present invention has been accomplished under the circumstances in view. It is therefore the main object of the present invention to provide a compact cable connector with filter function, which has the characteristics of small size and simple structure, facilitates fabrication and provides a filter function.

To achieve this and other objects of the present invention, a cable connector comprises an insulative block set, a circuit board set and a terminal set. The insulative block set comprises a docking member, and a terminal holder block assembly disposed at one side of the docking member. The docking member comprises a docking head. The terminal holder block assembly comprises a terminal holder block disposed at one side relative to the docking head. The circuit board set comprises an input circuit board, at least one output circuit board and a plurality of electronic components mounted on the output circuit board. The input circuit board is vertically mounted between the docking member and the terminal holder block. The at least one output circuit board is transversely mounted on the terminal holder block. The terminal set comprises a plurality of input terminals, a plurality of output terminals and a plurality of connection terminals. The input terminals are transversely mounted in the docking member and electrically bonded to the input circuit board. The output terminals are vertically mounted in the terminal holder block and electrically bonded to the at least one output circuit board. The connection terminals are electrically connected between the input circuit board and the at least one output circuit board.

BRIEF DESCRIPTION OF THE DRAWINGS

FIG. 8 is an exploded view of a cable connector in accordance with a third embodiment of the present invention.

DETAILED DESCRIPTION OF THE PREFERRED EMBODIMENT

Figure 1:
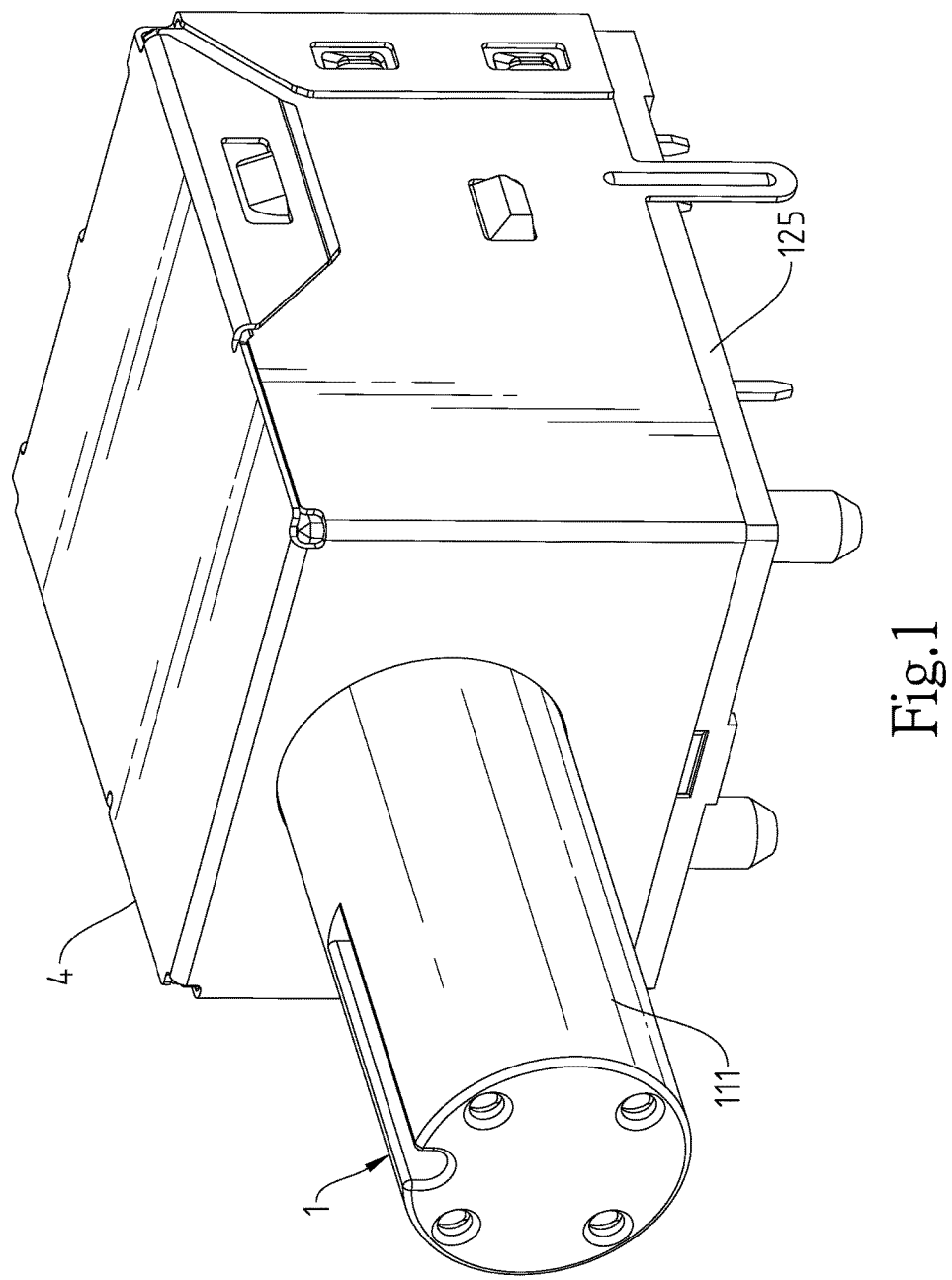
FIG. 1 is an oblique top elevational view of a cable connector in accordance with a first embodiment of the present invention.
Figure 2:
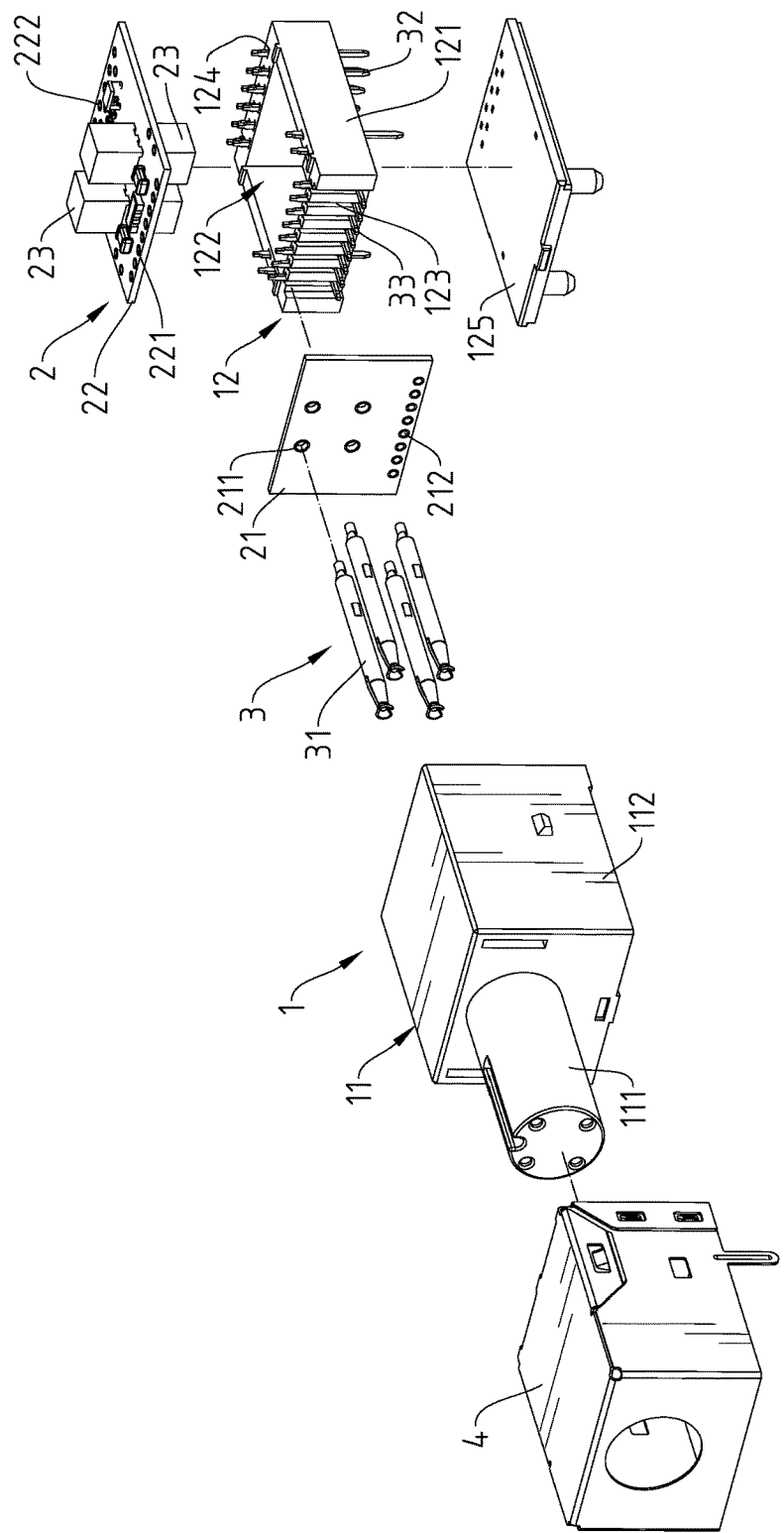
FIG. 2 is an exploded view of the cable connector in accordance with the first embodiment of the present invention.
Figure 3:
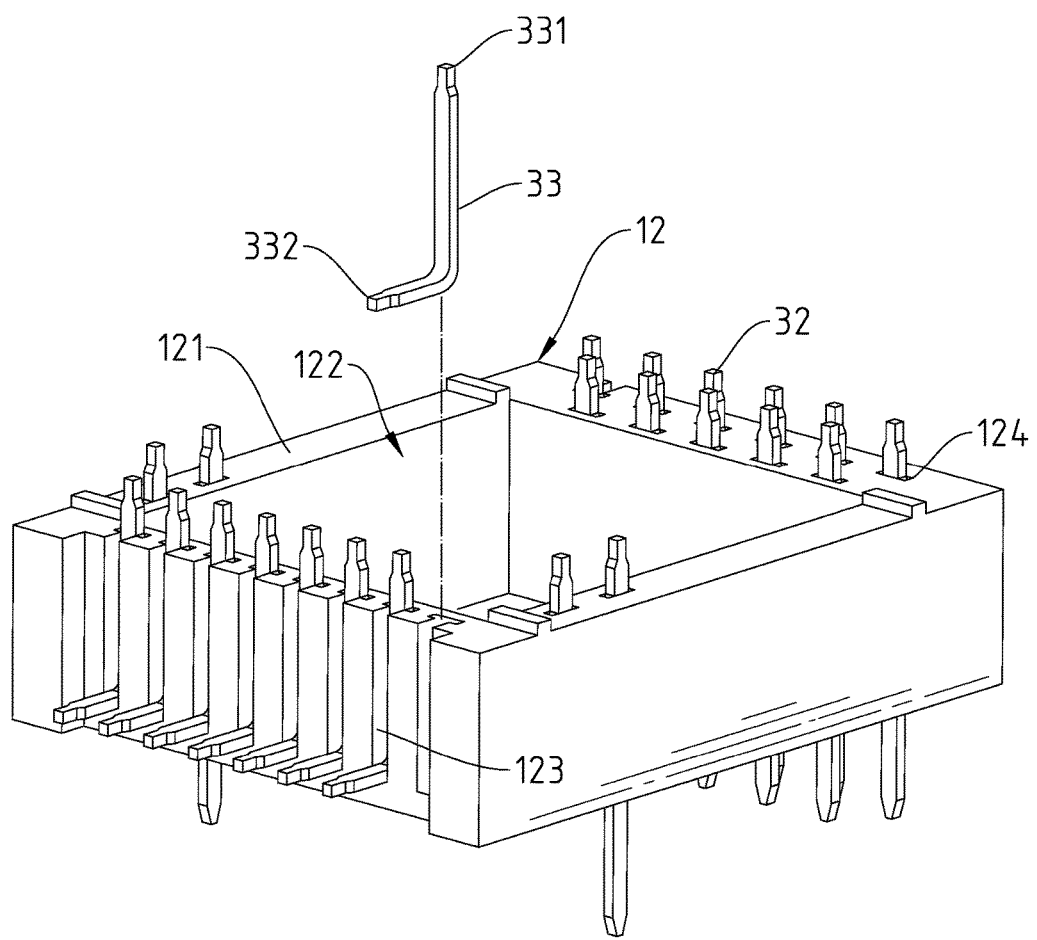
FIG. 3 is an exploded view of a part of the first embodiment of the present invention, illustrating the relationship between the connection terminals and the terminal holder block and the configuration of the connection terminals.
Figure 4:
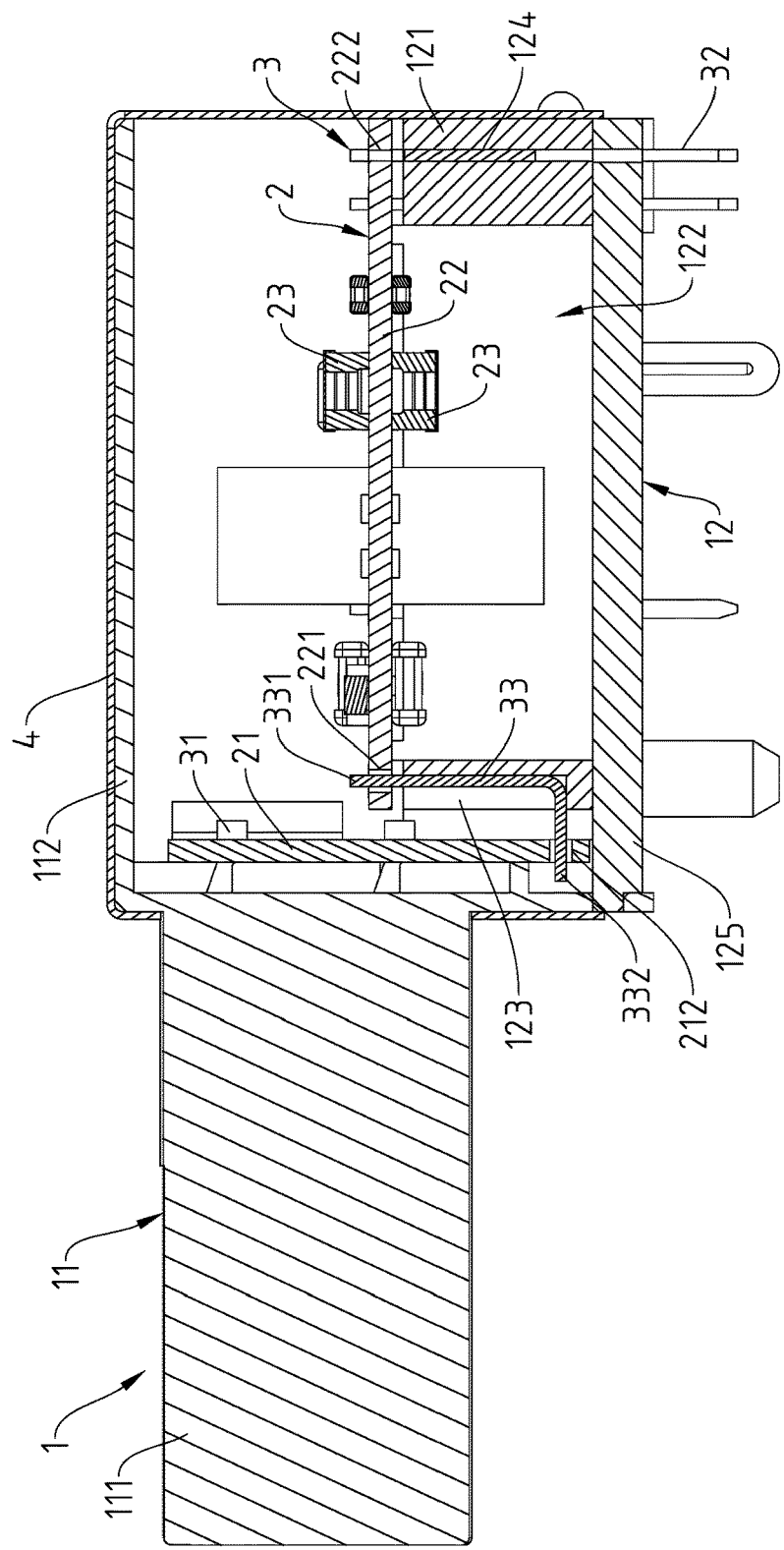
FIG. 4 is a sectional side view of the cable connector in accordance with the first embodiment of the present invention.

Referring to FIGS. 1-4, a cable connector in accordance with a first embodiment of the present invention is shown. The cable connector comprises an insulative block set 1, a circuit board set 2, a terminal set 3 and a shielding housing 4.

The insulative block set 1 comprises a docking member 11, and a terminal holder block assembly 12 mounted in the docking member 11. The docking member 11 comprises a docking head 111 and a docking body 112 connected with the docking head 111. The terminal holder block assembly 12 comprises a terminal holder block 121, and a bottom block 125 mounted to a bottom side of the terminal holder block 121. The terminal holder block assembly 12 is accommodated in the docking body 112 to keep the terminal holder block 121 at a rear side of the docking head 111. The circuit board set 2 comprises an input circuit board 21, an output circuit board 22, and a plurality of electronic components 23 mounted on the output circuit board 22. The input circuit board 21 is vertically mounted between the docking member 11 and the terminal holder block 121. The output circuit board 22 is transversely mounted on a top side of the terminal holder block 121. The terminal set 3 comprises a plurality of input terminals 31, a plurality of output terminals 32 and a plurality of connection terminals 33. The input terminals 31 are transversely mounted in the docking member 11 and electrically connected to the input circuit board 21. The output terminals 32 are vertically mounted in the terminal holder block 121 and electrically connected to the output circuit board 22. The connection terminals 33 are electrically connected between the input circuit board 21 and the output circuit board 22. The shielding housing 4 surrounds the docking body 112.

The terminal holder block 121 comprises an opening 122, a plurality of front terminal insertion holes 123 vertically disposed at a front side relative to the opening 122, and a plurality of rear terminal insertion holes 124 vertically disposed at an opposing rear side relative to the opening 122. The electronic components 23 on the output circuit board 22 adjacent to the terminal holder block 121 are accommodated in the opening 122. The front terminal insertion holes 123 are disposed near the docking head 111. The connection terminals 33 and the output terminals 32 are respectively mounted in the front terminal insertion holes 123 and the rear terminal insertion holes 124 so that the connection terminals 33 are disposed adjacent to the docking head 111. Each connection terminal 33 comprises a first bonding end 331 vertically disposed at a top side thereof, and a second bonding end 332 transversely disposed at an opposing bottom side thereof to face toward the docking head 111. The input circuit board 21 comprises a plurality of input via hole 211 and a plurality of connection via holes 212. The output circuit board 22 comprises a plurality of docking via holes 221 and a plurality of output via holes 222 respectively arranged at two opposite sides. The input terminals 31 have respective one ends thereof respectively and electrically bonded to the input via holes 211. The output terminals 32 have respective top ends thereof respectively and electrically bonded to the output via holes 222. The first bonding ends 331 of the connection terminals 33 are respectively and electrically bonded to the docking via holes 221.

Figure 5:
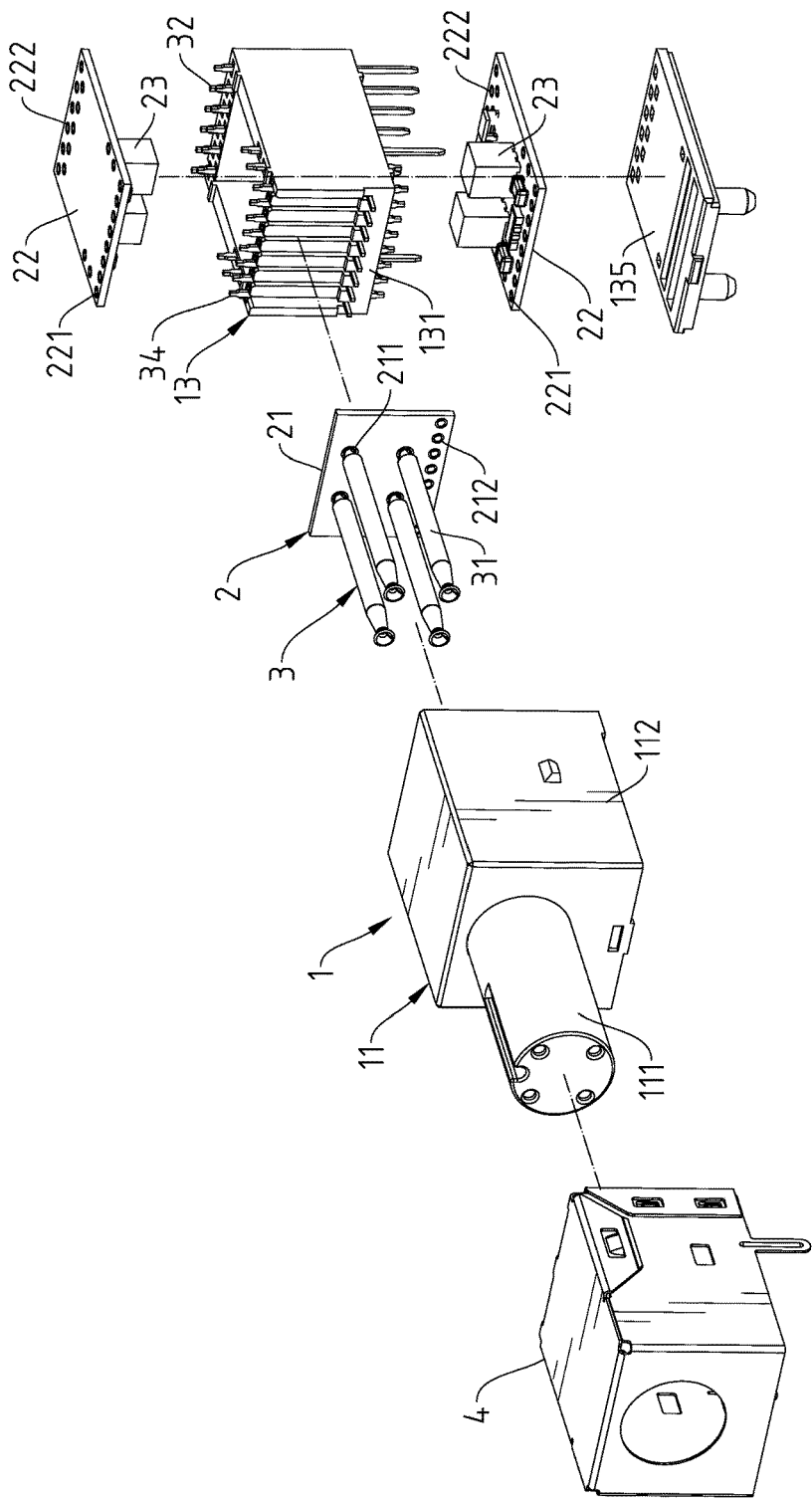
FIG. 5 is an exploded view of a cable connector in accordance with a second embodiment of the present invention.
Figure 6:
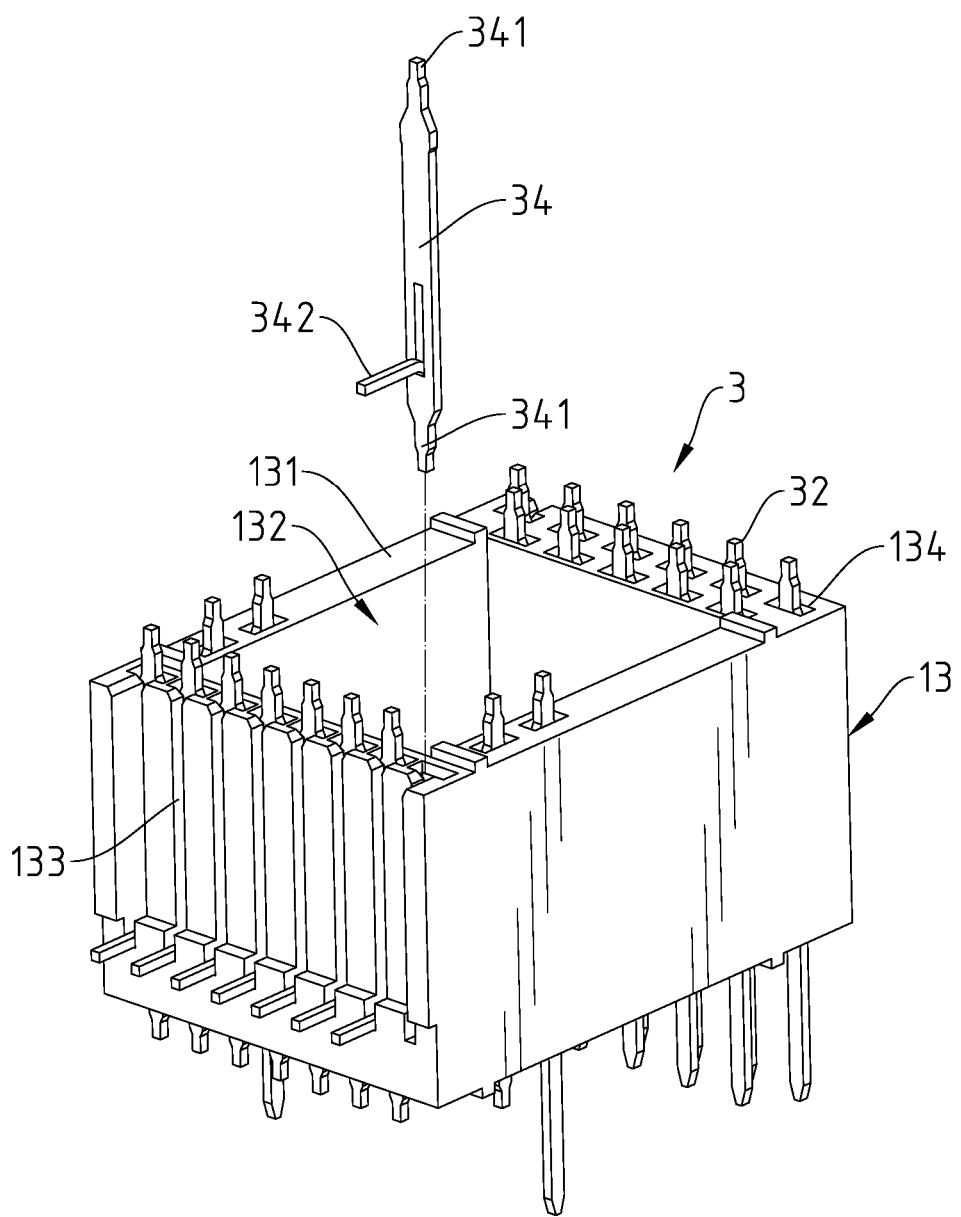
FIG. 6 is an exploded view of a part of the second embodiment of the present invention, illustrating the relationship between the connection terminals and the terminal holder block and the configuration of the connection terminals.
Figure 7:
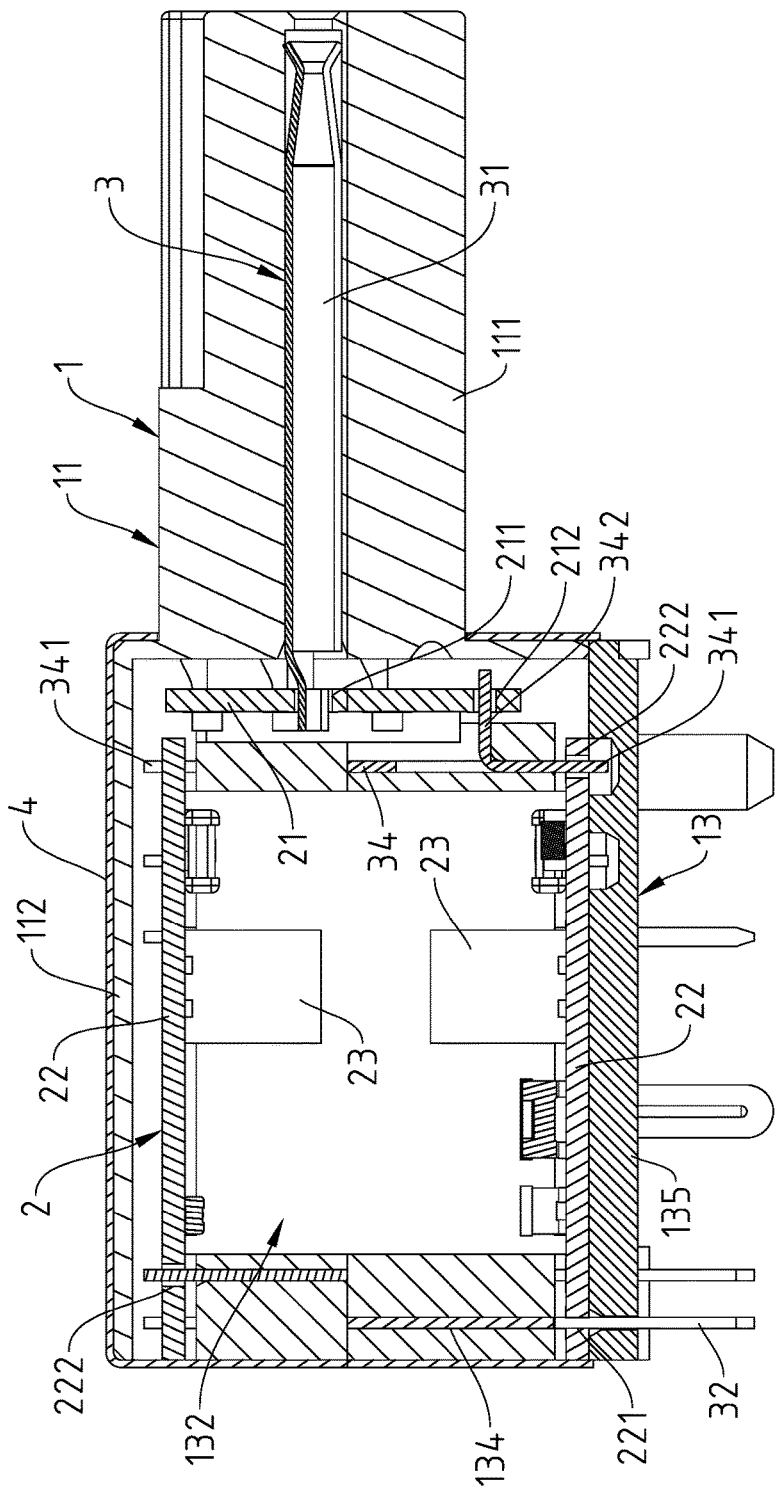
FIG. 7 is a sectional side view of the cable connector in accordance with the second embodiment of the present invention.

Referring to FIGS. 5-7, a cable connector in accordance with a second embodiment of the present invention is shown. This second embodiment is substantially similar to the aforesaid first embodiment with the exception that the circuit board set 2 comprises two output circuit boards 22 that are respectively and transversely mounted on opposing top and bottom sides of the terminal holder block 131 of the terminal holder block assembly 13; the output terminals 32 have the respective two opposite ends thereof respectively and electrically bonded to the two output circuit boards 22; each connection terminal 34 comprises two opposing first bonding ends 341 respectively and electrically bonded to one respective docking via hole 221 of one respective output circuit board 22, and a second bonding end 342 transversely disposed between the two opposing first bonding ends 341 and electrically bonded to one respective connection via hole 212 of the input circuit board 21.

Referring to FIG. 8, a cable connector in accordance with a third embodiment of the present invention is shown. This third embodiment is substantially similar to the aforesaid first embodiment with the exceptions outlined hereinafter.

The docking member 14 of the insulative block set 1 comprises a docking head 141, and a plug connection portion 142 extended from a rear side of the docking head 141. The plug connection portion 142 has a plurality of plug hole 143. The terminal holder block assembly 15 further comprises a top cover 152 covered on a top side of the terminal holder block 151. The input circuit board 24 of the circuit board set 2 comprises an input bonding portion 241 aimed at the docking head 141, a plurality of input via holes 242 located on the input bonding portion 241, two connection bonding portions 243 respectively outwardly extended from two opposite lateral sides of the input bonding portion 241, a plurality of connection via holes 244 located on the connection bonding portions 243, and a gap 245 defined between a top side of each connection bonding portion 243 and the input bonding portion 241. The output circuit board 25 comprises two docking bonding portions 251 respectively inserted into the gaps 245 between the input bonding portion 241 and connection bonding portions 243 of the input circuit board 24 and disposed adjacent to the docking head 141, and a plurality of docking via holes 252 located on each docking bonding portion 251. Each connection terminal 35 of the terminal set 3 comprises a vertically upwardly extended first bonding end 351, and a second bonding end 352 and a positioning end 353 respectively and transversely extended from a bottom side of the first bonding end 351 in reversed directions. The connection terminals 35 of the terminal set 3 are set between the input circuit board 24 and the plug connection portion 142 of the docking member 14 with the first bonding ends 351 respectively and electrically bonded to the docking via holes 252 of the output circuit board 25, the second bonding ends 352 respectively and electrically bonded to the connection via holes 244 of the input circuit board 24, and the positioning ends 353 respectively plugged into the plug holes 143 of the docking member 14. Further, a locknut set 5 is mounted to an outer side of the shielding housing 4.

What the invention claimed is:

1. A cable connector, comprising an insulative block set, a circuit board set and a terminal set, said insulative block set comprising a docking member and a terminal holder block assembly disposed at one side of said docking member, said docking member comprising a docking head, said terminal holder block assembly comprising a terminal holder block disposed at one side relative to said docking head, wherein:

said circuit board set comprises an input circuit board, at least one output circuit board and a plurality of electronic components mounted on said output circuit board, said input circuit board being vertically mounted between said docking member and said terminal holder block, said at least one output circuit board being transversely mounted on said terminal holder block, said terminal set comprising a plurality of input terminals, a plurality of output terminals and a plurality of connection terminals, said input terminals being transversely mounted in said docking member and electrically bonded to said input circuit board, said output terminals being vertically mounted in said terminal holder block and electrically bonded to said at least one output circuit board, said connection terminals being electrically connected between said input circuit board and said at least one output circuit board.

2. The cable connector as claimed in claim 1, wherein said at least one output terminals and said connection terminals of said terminal set are respectively vertically mounted in said terminal holder block at two opposite sides with said connection terminals disposed adjacent to said docking head; each said connection terminal comprises a first bonding end vertically disposed at a top side thereof and electrically bonded to said at least one output circuit board, and a second bonding end transversely disposed at an opposing bottom side thereof to face toward said docking head and electrically bonded to said input circuit board.

3. The cable connector as claimed in claim 1, wherein said circuit board set comprises a plurality of said output circuit boards respectively and transversely mounted on opposing top and bottom sides of said terminal holder block; said output terminals have respective opposite ends thereof respectively and electrically bonded to said multiple output circuit boards; each said connection terminal comprises two opposing first bonding ends respectively and electrically bonded to said multiple output circuit boards, and a second bonding end disposed between said first bonding ends and electrically bonded to said input circuit board.

4. The cable connector as claimed in claim 1, wherein said input circuit board of said circuit board set comprises an input bonding portion aimed at said docking head of said insulative block set, two connection bonding portions bilaterally extended from said input bonding portion, and a gap defined between a top side of each said connection bonding portion and said input bonding portion; said output circuit board comprises two docking bonding portions respectively inserted through said two gaps between said input circuit board and said docking head; said input terminals of said terminal set have respective one ends thereof electrically bonded to said input bonding portion; each said connection terminal comprises a vertically upwardly extended first bonding end bonded to one said docking bonding portion of said output circuit board, and a second bonding end transversely extended from a bottom side of said first bonding end and bonded to one said connection bonding portion of said input circuit board.

5. The cable connector as claimed in claim 4, wherein said docking member of said insulative block set further comprises a plug connection portion extended from a rear side of said docking head; each said connection terminal further comprises a positioning end extended from the bottom side of the first bonding end thereof opposite to the associating said second bonding end and plugged into said plug connection portion.

6. The cable connector as claimed in claim 1, wherein said terminal holder block of said insulative block set defines therein an opening for accommodating said electronic components.

\* \* \* \* \*